(12) United States Patent
Kao

(10) Patent No.: US 7,700,440 B2
(45) Date of Patent: Apr. 20, 2010

(54) METHOD OF MANUFACTURING A METAL-OXIDE-SEMICONDUCTOR WITH REDUCED ON-RESISTANCE

(75) Inventor: Ching-Hung Kao, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/045,683

(22) Filed: Mar. 10, 2008

(65) Prior Publication Data

US 2008/0160697 A1 Jul. 3, 2008

Related U.S. Application Data

(62) Division of application No. 11/460,631, filed on Jul. 28, 2006.

(60) Provisional application No. 60/595,838, filed on Aug. 9, 2005.

(51) Int. Cl.
*H01L 29/772* (2006.01)

(52) U.S. Cl. ................................ 438/268; 257/E21.4

(58) Field of Classification Search ................ 438/268, 438/282, 286, 301; 257/328, 335, 336, 341, 257/342, E21.41, E21.417, E21.418, E21.42, 257/288, E21.4, E21.409

See application file for complete search history.

(56) References Cited

U.S. PATENT DOCUMENTS

| 4,344,081 | A | 8/1982 | Pao et al. |
| 4,819,052 | A | 4/1989 | Hutter |
| 5,569,949 | A | 10/1996 | Malhi |
| 6,130,458 | A | 10/2000 | Takagi |
| 6,432,775 | B2 * | 8/2002 | Blanchard .................... 438/270 |
| 6,590,240 | B1 * | 7/2003 | Lanois ........................ 257/256 |
| 6,762,098 | B2 | 7/2004 | Hshieh et al. |
| 6,773,995 | B2 * | 8/2004 | Shin et al. ................... 438/270 |
| 6,774,434 | B2 | 8/2004 | Hueting |
| 6,835,629 | B2 | 12/2004 | Fallica |
| 2004/0241950 | A1 | 12/2004 | Olofsson |
| 2005/0087834 | A1 | 4/2005 | Norstrom et al. |
| 2006/0030142 | A1 * | 2/2006 | Grebs et al. ................ 438/618 |

* cited by examiner

*Primary Examiner*—Matthew Smith
*Assistant Examiner*—Michele Fan
(74) *Attorney, Agent, or Firm*—Winston Hsu

(57) ABSTRACT

The trench MOS transistor according to the present invention includes a drain region in a form of a trench filled with a semiconductor material. The trench has a bottom surface and side surfaces and extends vertically downward from the top surface of the covering layer into the buried layer, the bottom surface of the trench lies in the buried layer, an insulating layer lines the side surfaces of the trenches, and the semiconductor material within the trench overlies the insulating layer and contacts the buried layer at the bottom surface of the trench.

6 Claims, 7 Drawing Sheets

METHOD OF MANUFACTURING A METAL-OXIDE-SEMICONDUCTOR WITH REDUCED ON-RESISTANCE

CROSS REFERENCE TO RELATED APPLICATIONS

This application is a divisional application of U.S. patent application Ser. No. 11/460,631 filed Jul. 28, 2006, which claims priority from U.S. provisional application No. 60/595,838 by Kao, filed Aug. 9, 2005, entitled "Trench vertical DMOS structure". Both are herein incorporated by reference in their entirety.

BACKGROUND OF THE INVENTION

1. Field of the Invention

This invention relates generally to semiconductor devices and fabrication methods thereof and, more particularly, to trench DMOS type semiconductor devices and fabrication methods thereof.

2. Description of the Prior Art

DMOS transistors (double diffused metal-oxide-semiconductor field effect transistors) (also referred to herein as DMOSFETs) are a type of MOSFET that use diffusion to form the transistor regions. These DMOS type devices took on various shapes and configurations. A typical discrete DMOS circuit includes one or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor.

U.S. Pat. No. 4,344,081 disclosed a DMOS type of semiconductor device that can also operate as a bipolar transistor and a fabrication method thereof. Referring to FIG. 1, a combined (N channel) DMOS and lateral NPN integrated structure is shown. An epitaxial layer 12 of N type conductivity is grown on the starting N+ semiconductor substrate. The DMOS device has a source region 22 and a drain region 24B of, for example, N+ conductivity, and the source region 22 is surrounded by a P type base region 20, thus providing a channel. A gate electrode 24 is disposed over the channel with an insulating layer 14 therebetween. A gate electrode contact 30 is provided to the gate electrode 24 through an opening in an insulating layer substantially enclosing the gate electrode 24. The source region 22 has its own electrode 28. The drain region 24B has its own electrode 28B at the same side of the gate electrode 24 and the electrode 28. A separate electrode 26A is provided to the P type base region 20 that surrounds the N+ source region 22. Accordingly, a lateral NPN transistor structure is provided by the N+emitter region 22, the P type base region 20, and the N+ collector region 24B, and the (N channel) DMOS device structure is provided by the N+ source region 22, the P type channel portion 20 (beneath the spaced doped polysilicon gate 24), and the N+ drain region 24B. However, the area between the source region and the drain region for the electric current path is still large, on-resistance ($R_{on}$) is still high.

Another type of DMOS transistor is a "trench DMOS transistor" in which the channel is formed vertically and the gate is formed in a trench extending between the source and drain. The trench, which is lined with a thin oxide layer and filled with polysilicon, allows less constricted current flow and thereby provides lower values of specific on-resistance (forward-biased voltage drop). FIG. 2 illustrates a conventional trench DMOS structure in which the individual cells are rectangular in shape in a horizontal cross-section. The structure includes, in this embodiment, an N+ substrate 31 on which is grown a lightly n-doped epitaxial layer 32. Within doped epitaxial layer 32, a body region 33 of opposite conductivity is provided. An n-doped epitaxial layer 34 that overlies much of the body region 33 serves as the source. A rectangularly shaped trench 35 is provided in the epitaxial layers, which is open at the upper surface of the structure and defines the perimeter of the transistor cell. A gate oxide layer 36 lines the bottom and sidewalls of the trench 35. The trench 35 is filled with polysilicon, i.e., polycrystalline silicon. A drain electrode is connected to the back surface of the semiconductor substrate 31, a source electrode 37 is connected to the source regions 34 and the body region 33, and a gate electrode is connected to the polysilicon that fills the trench 35.

As indicated, the DMOS transistor shown in FIG. 2 has its gate positioned in a vertically oriented trench. This structure is often called a trench vertical DMOS. It is "vertical" because the drain contact appears on the back or underside of the substrate and because the channel flow of current from source to drain is approximately vertical. This minimizes the higher resistance associated with bent or curved current paths or with parasitic field effect construction. The device is also doubly diffused (denoted by the prefix "D") because the source region is diffused into the epitaxial material on top of a portion of the earlier-diffused body region of opposite conductivity type. This structure uses the trench sidewall area for current control by the gate and has a substantially vertical current flow associated with it. As previously mentioned, this device is particularly appropriate for use as a power switching transistor where the current carried through a given transverse silicon area is to be maximized. However, such structure has disadvantages that the gate oxide obtained from the silicon oxidation of trench sidewall after etching has a relatively poor properties, as well as it is only suitably used as a discrete element but not suitably used in an IC for the drain region is formed at the back side of the substrate.

Therefore, there is still a need for a novel trench DMOS having a small Ron and being suitable for an integrated circuit (IC) process, while without the problem of poor gate oxide.

SUMMARY OF THE INVENTION

It is an object of the present invention to provide a novel trench DMOS transistor, which has a small Ron and being suitable for IC process, while without the problem of poor gate oxide.

It is another object of the present invention to provide a method of manufacturing the novel trench DMOS transistor.

The trench MOS transistor according to the present invention comprises a substrate; a buried layer of a heavily doped first conductivity type on the substrate; a covering layer of the first conductivity type lying on the buried layer; a body region of the second conductivity type in the covering layer; a first semiconductor region of the first conductivity type within the body region; a second semiconductor region in a form of a trench filled with a semiconductor material of the first conductivity type adjacent to the body region, wherein, the trench has a bottom surface and side surfaces and extending vertically downward from the top surface of the covering layer into the buried layer, the bottom surface of the trench lies in the buried layer, an insulating layer lines the side surfaces of the trenches, and the semiconductor material within the trench overlies the insulating layer and contacts the buried layer at the bottom surface of the trench; a gate dielectric layer disposed on the body region and the covering layer; and a gate electrode on the gate dielectric layer.

In another aspect, the MOS transistor according to the present invention comprises a substrate; a buried layer of a heavily doped first conductivity type on the substrate; a covering layer of the first conductivity type lying on the buried layer; a plurality of body regions of the second conductivity type in the covering layer; a plurality of first semiconductor regions of the first conductivity type within the body regions; a plurality of second semiconductor regions each disposed between two adjacent body regions and in a form of a trench filled with a semiconductor material of the first conductivity type, wherein, each trench has a bottom surface and side surfaces and extending vertically downward from the top surface of the covering layer into the buried layer, the bottom surface of the trench lies in the buried layer, an insulating layer lines the side surfaces of the trenches, and the semiconductor material within the trench overlies the insulating layer and contacts the buried layer at the bottom surface of the trench; a plurality of gate dielectric layers disposed on the body regions and the covering layer; and a plurality of gate electrodes formed on the gate dielectric layers.

In still another aspect, the MOS transistor according to the present invention comprises a substrate; a buried layer of a heavily doped first conductivity type on the substrate; a covering layer of the first conductivity type lying on the buried layer; two first semiconductor regions respectively in a form of a trench filled with a semiconductor material of the first conductivity type, wherein, each trench has a bottom surface and side surfaces and extending vertically downward from the top surface of the covering layer through the buried layer, the bottom surface of the trench lies in the buried layer, an insulating layer lines the side surfaces of the trenches, and the semiconductor material within the trench overlies the insulating layer and contacts the buried layer at the bottom surface of the trench; two body regions of the second conductivity type formed in the covering layer between the two first semiconductor regions; one second semiconductor regions of the first conductivity type formed within each of the body regions, respectively; a gate dielectric layer disposed on the two body regions and the covering layer between the two body regions; and a gate electrode formed on the gate dielectric layer.

The method of manufacturing a MOS transistor according to the present invention comprises the steps as follows. First, a substrate is provided. A buried layer of a heavily doped first conductivity type is formed on the substrate. A covering layer of the first conductivity type is formed on the buried layer. A body region of a second conductivity type is formed in the covering layer. Next, a trench having a bottom surface and side surfaces is formed to extend vertically downward from the top surface of the covering layer into the buried layer, wherein the bottom surface of the trench lies in the buried layer. An insulating layer is formed to line the side surfaces of the trenches. A semiconductor material of the first conductivity type as a source/drain region is filled within the trench to contact the buried layer at the bottom surface of the trench, while a space in the top portion of the trench is not filled with the semiconductor material. Subsequently, a shallow trench insulation is formed in the space in the top portion of the trench. A gate is formed on the body region and the covering layer. Finally, a source/drain region is formed within the body region.

The present invention is advantageous in that it provides a MOS transistor in which one source/drain region is in a form of trench, such that the $V_d/I_d$ is small due to the high concentration of N typed dopants in the trench and N+ buried layer composed at the trench end, and the spacing between the pair of source and drain regions is small. Accordingly, the $R_{on}$ can be significantly reduced. Furthermore, since the electrodes for the gates, source regions, and drain regions can be at the same side of the substrate, the transistor is suitably used in an integrated circuit in addition to being used as a discrete device. Furthermore, the depth of the trench can be made according to the breakdown voltages as desired without remarkably changing the area of the device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
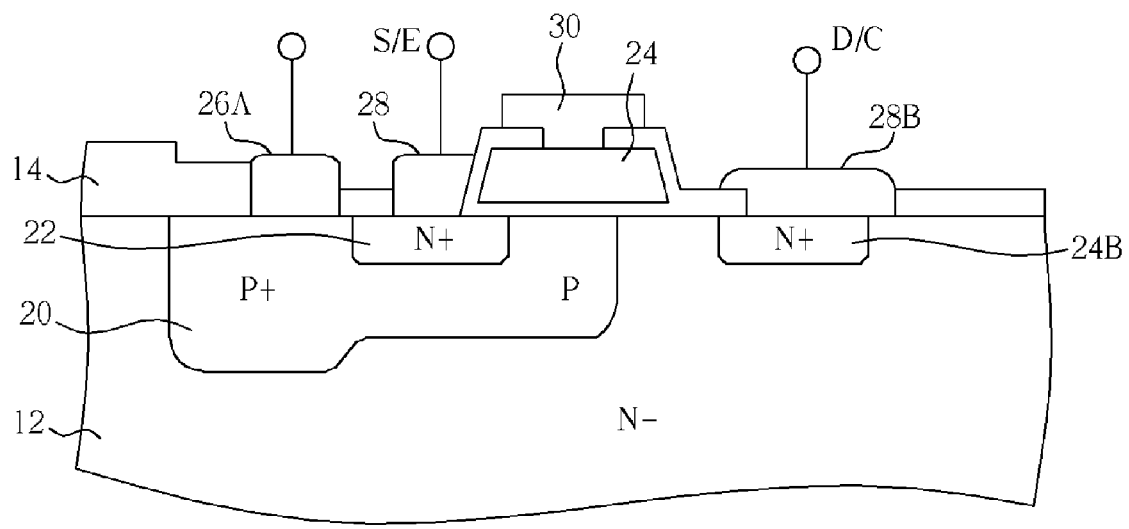
FIG. 1 shows a cross-sectional view of a conventional DMOS type of semiconductor device.
Figure 2:
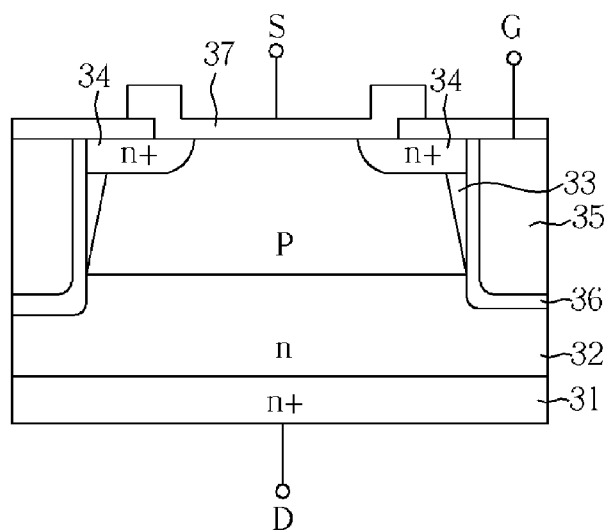
FIG. 2 shows a cross-sectional view of a conventional trench DMOS transistor.
Figure 3:
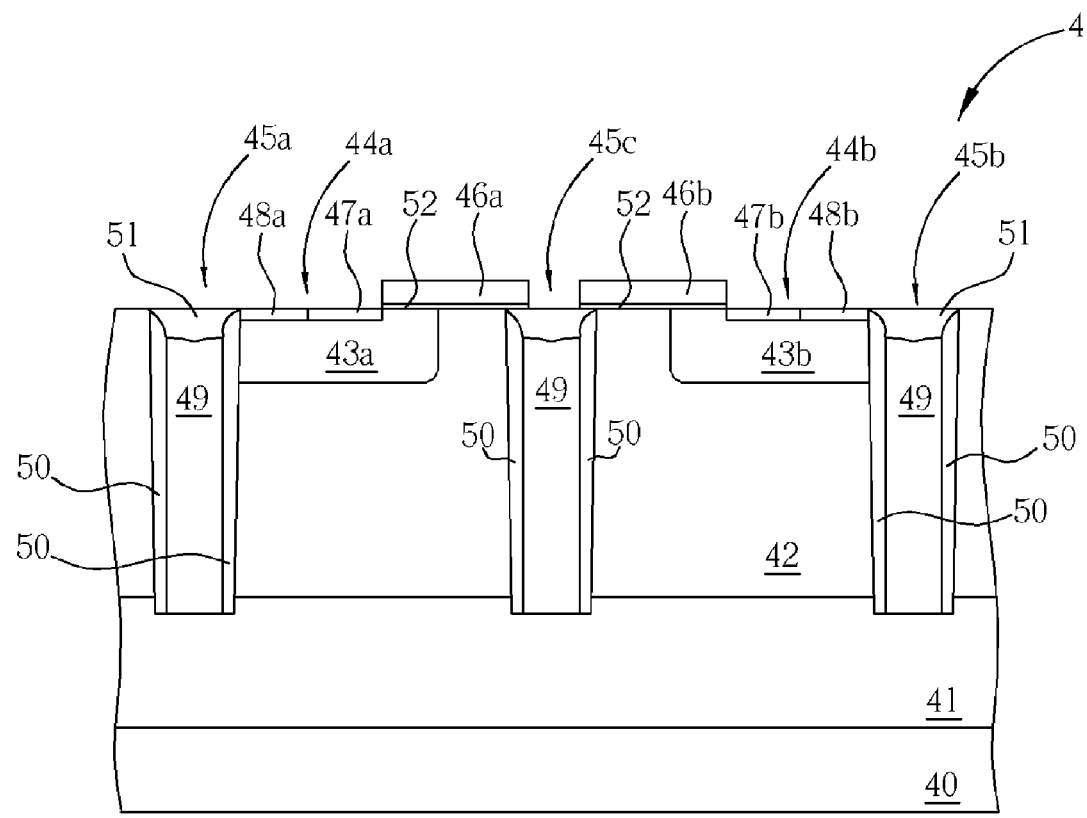
FIGS. 3-6 show cross-sectional views of embodiments of the trench DMOS transistor according to the present invention.

The present invention is more described in detail by the embodiments set forth as follows. FIG. 3 shows a cross-sectional view of an embodiment of the MOS transistor according to the present invention. It is understood that the charge properties shown in figures are exemplary, and suitable modification of the polarities can be made.

The MOS transistor 4 includes a substrate 40, a heavily doped buried region 41, and a covering layer 42, which is more lightly doped than the buried region 41. The substrate 40 may be P type. The buried region 41 is relatively highly doped with N type dopants. The covering layer 42 is relatively lightly doped with N type dopants and may be an epitaxial layer formed by an epitaxial growth or a doped layer formed by implantation. The epitaxial layer will typically be preferred when the transistor is designed being used in a very high voltage environment, since a relative large thickness of the epitaxial layer can be easily attained. The MOS transistor 4 also includes body regions 43a and 43b, first semiconductor regions 44a, 44b, second semiconductor regions 45a, 45b, 45c, and gates 46a, 46b. The body regions 43a, 43b may be a doped region with P type dopants or may include a deeper more heavily doped region and a shallower more lightly doped region, with P type dopants. The first semiconductor regions 44a, 44b may serve as source regions and be relatively highly doped with N type dopants or include heavily N type doped regions 47a, 47b and heavily P type doped regions 48a, 48b abutting the N type doped regions 47a, 47b. The second semiconductor regions 45a, 46b, 46c may serve as drain regions and be formed in trenches. Each trench is filled with a semiconductor material 49 heavily doped with N type dopants. The trench has a bottom surface and side surfaces and extends vertically downward from the top surface of the covering layer 42 into the buried layer 41, such that the bottom surface of the trench lies in the buried layer 41. An insulating layer 50 lines the side surfaces of the trenches for electrical insulation, while the semiconductor material 49 contacts the buried layer 41 at the bottom surface of the trench. A shallow trench isolation 51 is formed in the top portion of the trench for electrical isolation. Gates 46a, 46b overlies the body regions 43a, 43b and the covering layer 42, with a gate insulation layer 52 therebetween. The gates and the semiconductor material filled in the trenches may comprise polysilicon. The N type dopants may be for example phosphorous or arsenic. The P type dopants may be for example boron or $BF_2$. The epitaxial layer may comprise arsenic doped silicon/germanium.

In the MOS transistor 4, one structural unit may be deemed to include the gate, the first semiconductor region, the second semiconductor region, the body region, the covering layer, and the buried layer formed on the substrate. The gate, the first semiconductor region, the second semiconductor region, and the body region may be arranged variously. For example, the gate 46a, the first semiconductor region 44a, and the second semiconductor region 45a as well as the covering layer 42, the buried layer 41, and the substrate 40 may be deemed as a unit, or the gate 46a, the first semiconductor region 44a, and the second semiconductor region 45c as well as the covering layer 42, the buried layer 41, and the substrate 40 may be deemed as a unit. Accordingly, the MOS transistor according to the present invention may take on various shapes and configurations. For example, the MOS transistor 4 shown in FIG. 3 includes two sets of MOS transistor units and a second semiconductor region 45c, which may be fabricated in parallel (a bar shape) or in a shape of concentric circle, rectangle, or any polygon.

Figure 4:
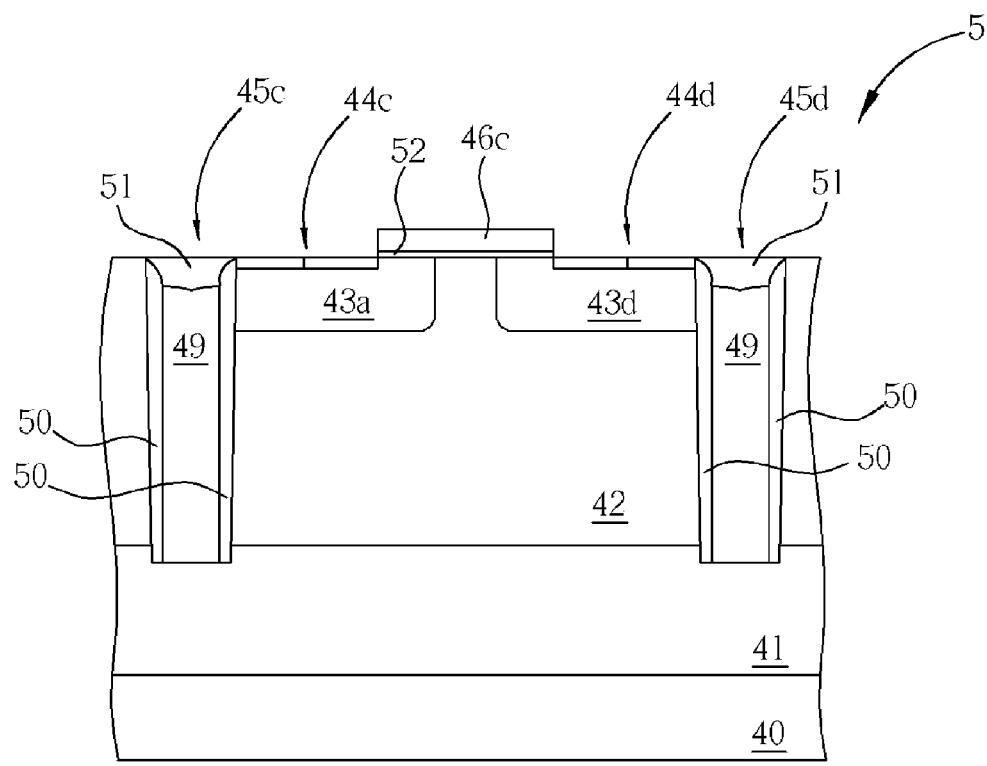

FIG. 4 shows another embodiment of the present invention. The MOS transistor 5 includes a substrate 40, a heavily doped buried region 41, a covering layer 42, two first semiconductor regions 44c, 44d within two body regions 43c, 43d, respectively, two second semiconductor regions 45d abutting the first semiconductor regions 44c, 44d, respectively, and a gate on the body regions 43c, 43d and the covering layer 42 between the two first semiconductor regions 44c, 44d. The MOS transistor 5 shown in FIG. 4 includes two sets of MOS transistor units using a same gate 46c, which may be fabricated in parallel (a bar shape) or in a shape of concentric circle, rectangle, or any polygon. The MOS transistor 5 may be a discrete MOS in a shape of concentric circle, rectangle, or any polygon taking one of the gate 46c, the first semiconductor regions 44c, 44d, and the second semiconductor region 45d as a centric part.

Figure 5:
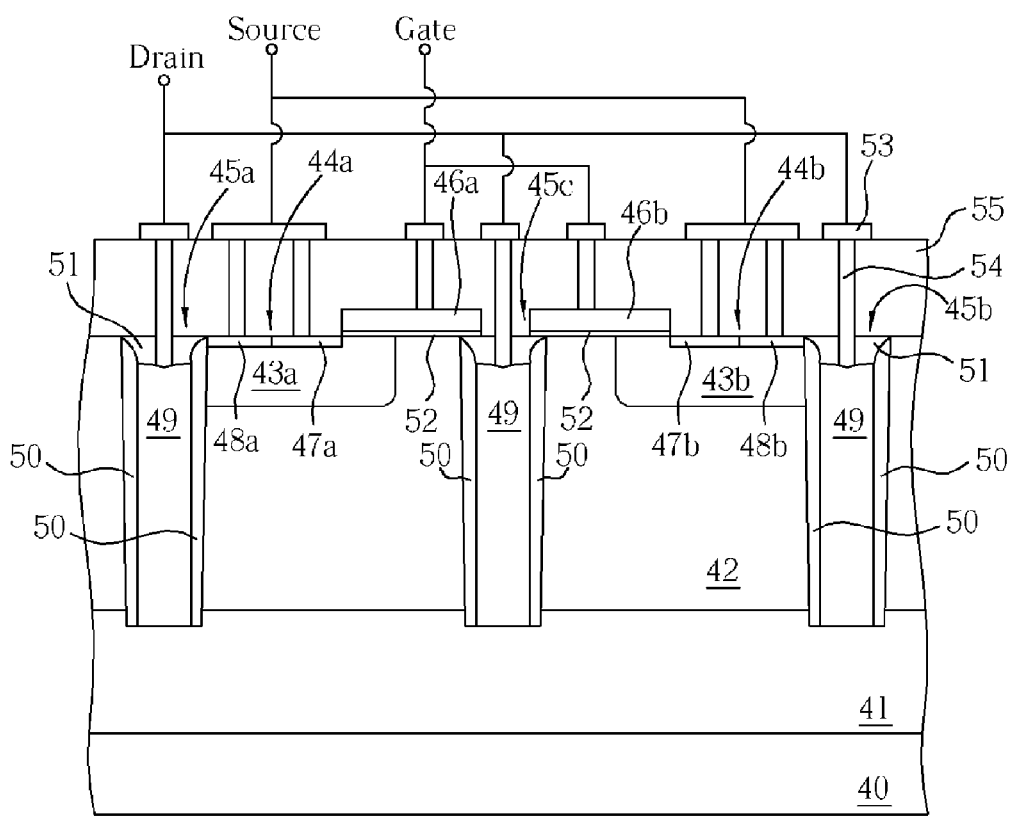
Figure 6:
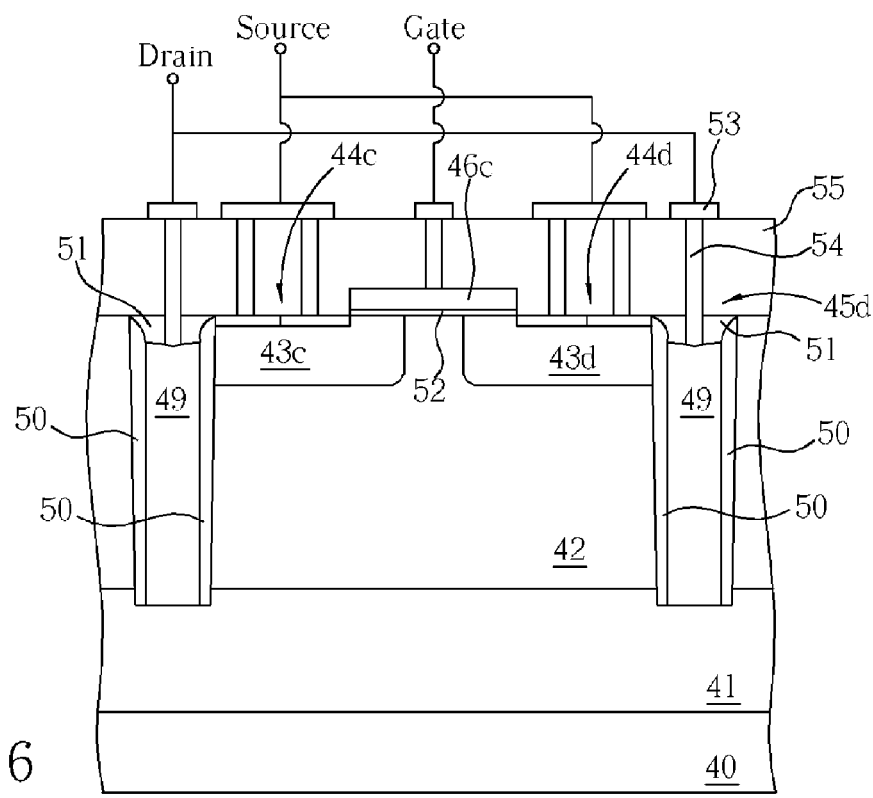

The MOS transistor may further include a plurality of metal lines connecting the gates, the first semiconductor regions, and the second semiconductor regions, through contact plugs in a dielectric layer. Referring to FIGS. 5 and 6, the gates, the first semiconductor regions, and the second semiconductor regions are all shorted together by metal lines 53 through contact plugs 54 in the dielectric layer 55, respectively, at the same side of the substrate, to a gate terminal, a source terminal and a drain terminal. Thus, even though the discrete DMOS circuit is constructed from a matrix of smaller transistors, it behaves as if it were a single large transistor.

In the MOS transistor according to the present invention, when the gate is applied with a proper voltage, the electrons flow from the source region, passing the cover layer, into the buried layer, and then enter the trench drain to the drain terminal. It is known that Ron is calculated by $V_d/I_d \times$(spacing between drain contact and source contact). As it can be seen, in such structure of the present invention, the spacing between the source (for example, the first semiconductor region 44a) and the drain (for example, the second semiconductor region 45a) can be easily made to be under, for example, 1.5 µm, and the $V_d/I_d$ can be small due to the high concentration of N+ polysilicon (the semiconductor material in the trench) and N+ buried layer composed at the drain end. Accordingly, the Ron can be reduced significantly.

The thickness of the covering layer (for example, the N− epitaxial layer) as well as the depth of the trench in the MOS transistor of the present invention can be made according to the breakdown voltages as desired. As the breakdown voltage is larger, the covering layer (for example, the N− epitaxial layer) needs to be thicker, while the area for the device will not be remarkably changed.

Figure 7:
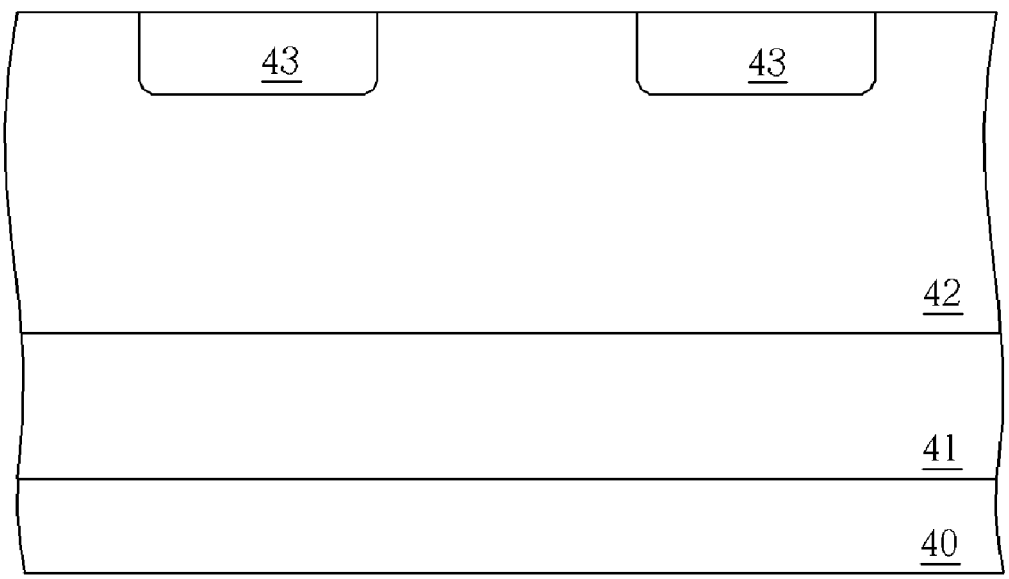
FIGS. 7-14 shows an embodiment of the method of manufacturing the trench DMOS transistor according to the present invention.

FIGS. 7-14 shows an embodiment of the manufacturing method of the MOS transistor according to the present invention. Referring to FIG. 7, a substrate 40, such as N type or P type substrate, is provided. A buried layer 41 is formed by, for example, a photolithography and an implantation of N type or P type dopants into the substrate using a high-energy implanter followed by a drive-in process. A covering layer 42 of N type or P type doped semiconductor material is formed on the buried layer 41 using an epitaxial growth or an implantation process. Subsequently, body regions 43 are formed in the covering layer 42 by a photolithography and an implantation process. In this embodiment, the substrate 40 is P type, the buried layer 41 is relatively highly doped with N type dopants, the covering layer 42 is an epitaxial layer relatively lightly doped with N type dopants, and the body regions 43 are doped with P type dopants.

Figure 8:
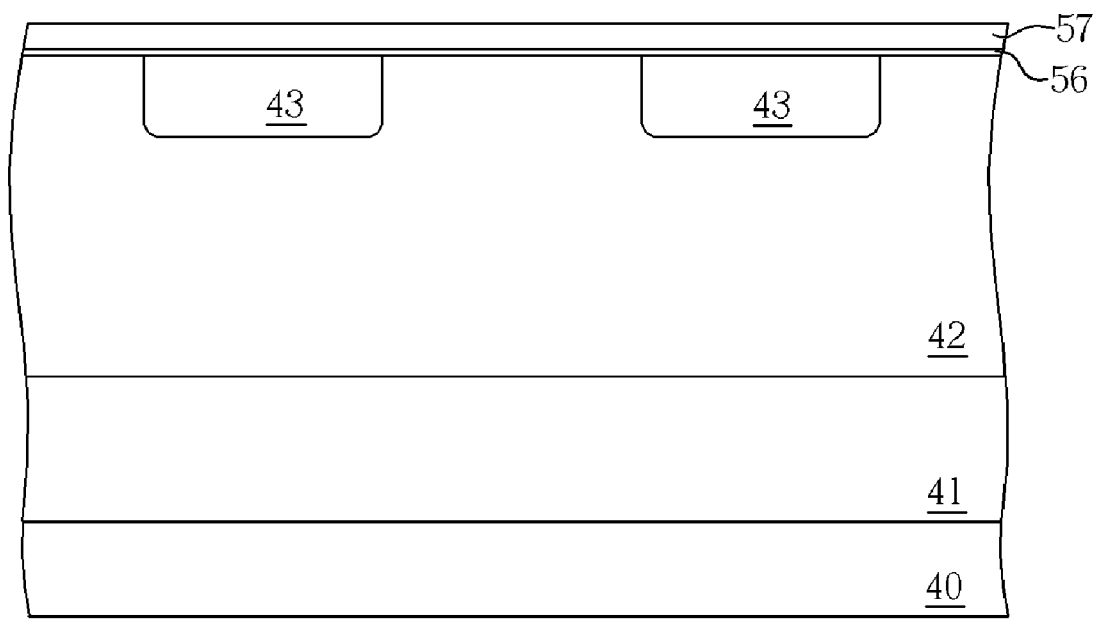
Figure 9:
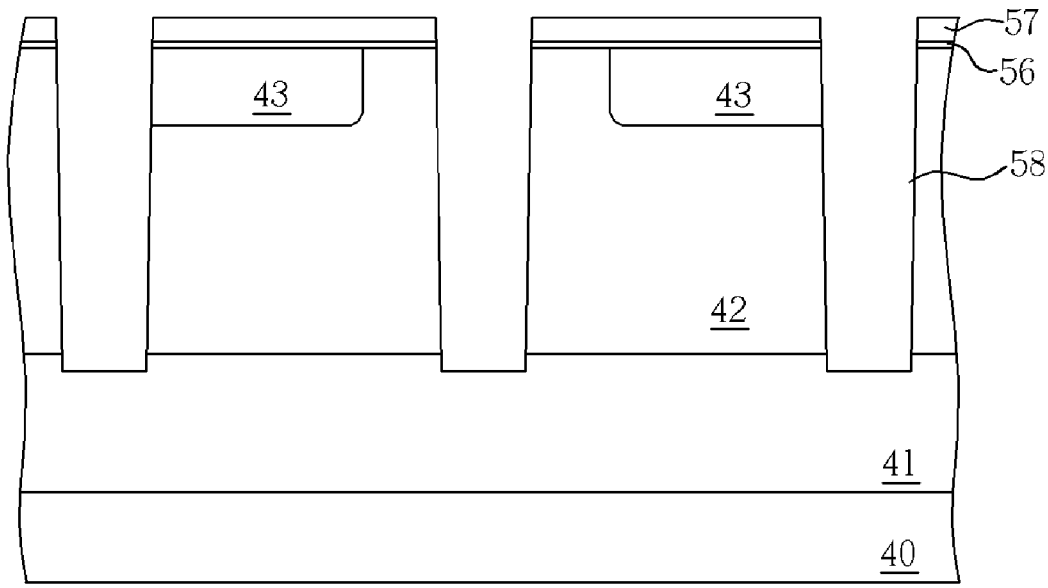

Referring to FIG. 8, a cap layer, such as a pad oxide layer 56, and a nitride layer 57 over the pad oxide layer 56, may be further deposited on the covering layer 42 to overlie the body region 43. Referring to FIG. 9, trenches 58 are formed abutting or with a space from the body regions 43 by a photolithography and an etching process. The trenches 58 is deep and may be preferably formed by a dry etching process, such as reactive ion etching, to a depth such that the trench 58 extends vertically downward from the top surface of the covering layer 42 into the buried layer 41, that is, the bottom of the trench 58 lies in the buried layer 41. The depth of the trench 58 is not specific limited and will depend on the thickness of the covering layer 42, which in turn depends on the breakdown voltage as desired, and may be, for example, from 1.5 to 2.5 microns.

Figure 10:
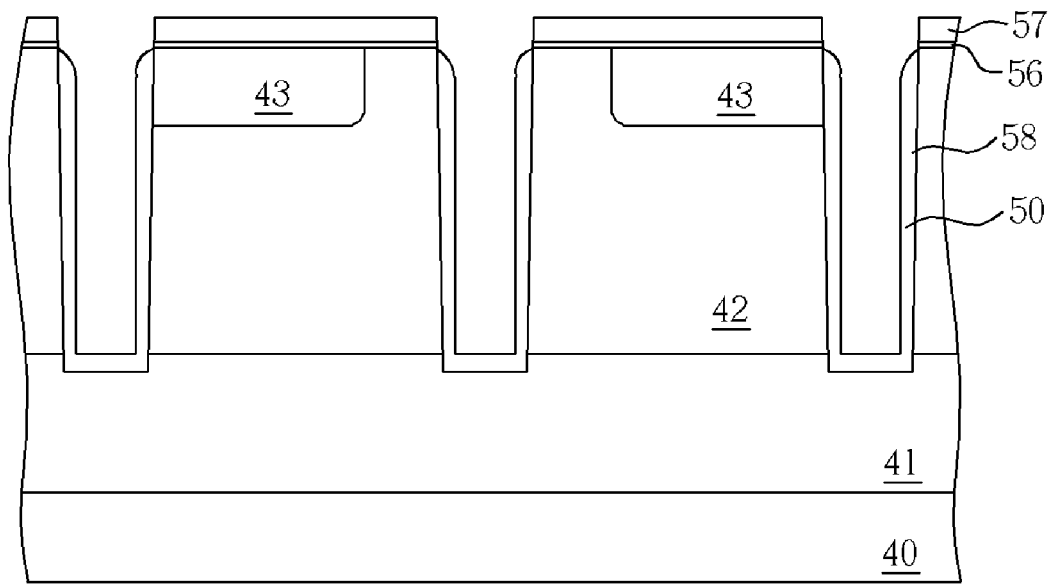

Referring to FIG. 10, an insulating layer 50 is formed on the side surface and the bottom surface of the trenches 58 by, for example, performing a liner oxidation on the trenches 58 to form a liner oxide. The thickness of the insulating layer is not critical as compared to that of the insulating layer in a trench gate used in the conventional techniques. In the conventional techniques, the insulating layer lining the sidewall and bottom of the gate trench and functioning as a gate dielectric layer must be controlled in a suitable thickness and good qualities, which are relatively difficult to achieve.

Figure 11:
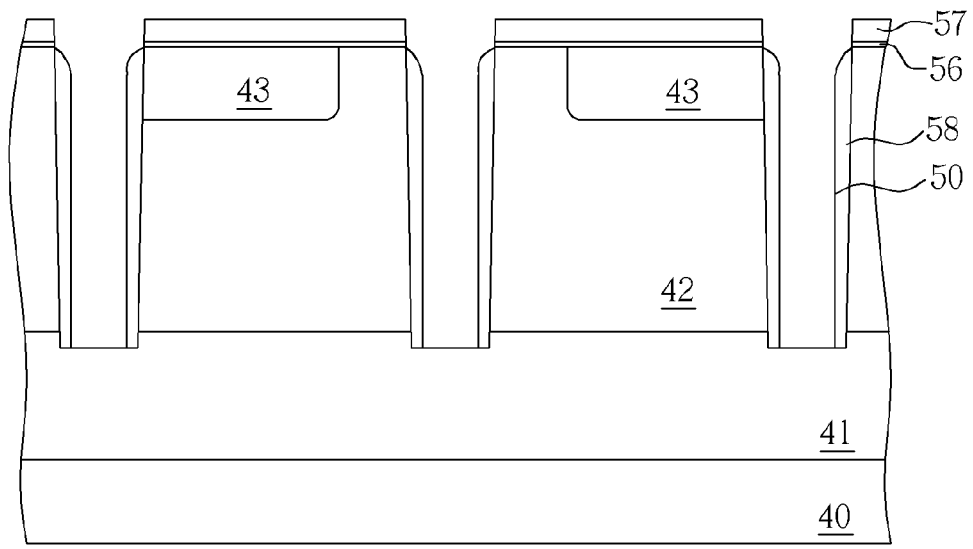

Referring to FIG. 11, the liner oxide is etched back to remove the bottom part of the insulating layer 50, such that the material subsequently filled in the trench can contact the buried layer 41. After the bottom part of the insulating layer is removed, a blanket N+ implantation may be further performed on the surface of the buried layer in the trenches 58 to prevent undesired resistance once the trench has an insufficient depth.

Figure 12:
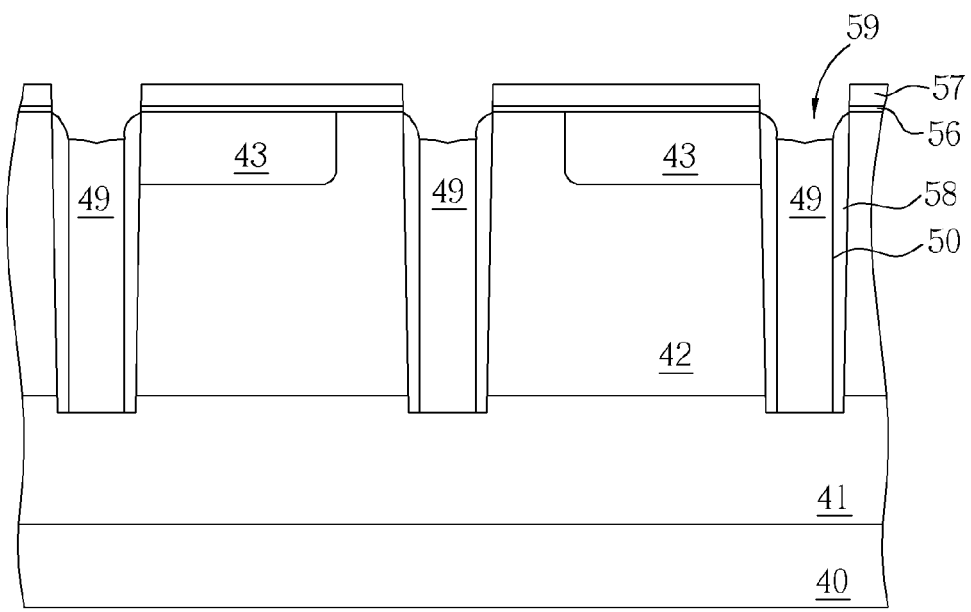

Referring to FIG. 12, a semiconductor material 49 of N type or P type is filled into the trenches 58 as source/drain regions to contact the buried layer 41 at the bottom surface of the trenches and a space is not filled in the top portion of the trench. The semiconductor material 49 may be allowed to fully fill the trenches 58 having an insulating layer 50 and thereafter be etched back using the nitride layer 57 as a hard mask to remove the top portion of the semiconductor material 49 in the trenches 58, leaving a space 59. The semiconductor material 49 of N type or P type may be an N+ or P+ doped polysilicon, and the N+ doped polysilicon is used in this embodiment. The doping can be carried out, for example, during CVD with phosphorous chloride or by implantation with arsenic or phosphorous.

Figure 13:
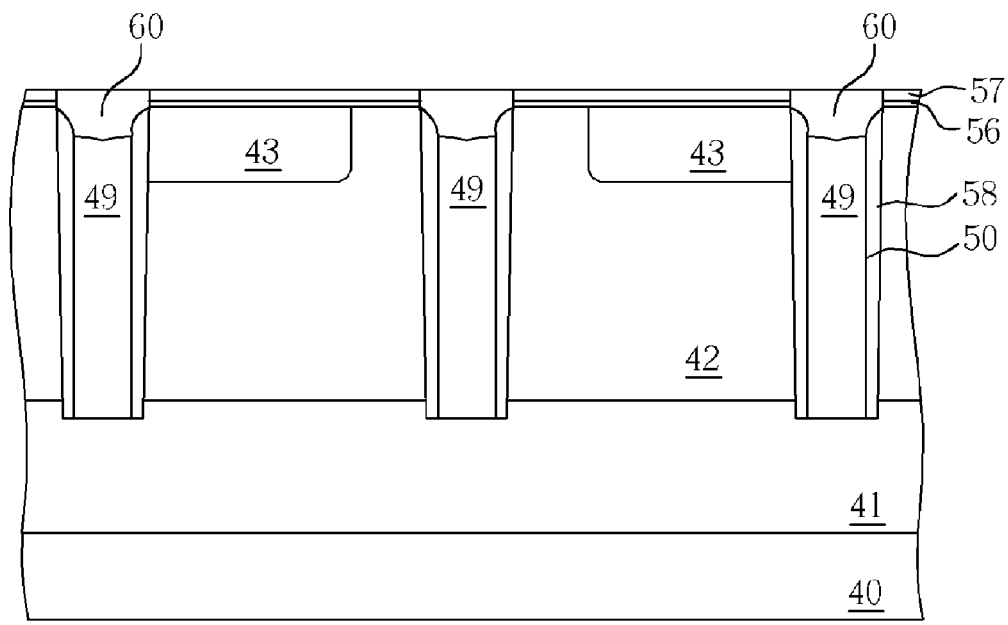

Referring to FIG. 13, a shallow trench isolation (STI) process is performed to form an STI structure 60 in the space 59, for isolation of the top surface of the filled semiconductor material 49, by deposition of a layer of insulating material, such as silicon oxide, on the trench and the cap layer to fill the space 59 in the top portion of the trenches 58. Subsequently, a planarization, such as a chemical mechanical planarization (CMP) process is performed using the nitride layer 57 as a stop layer, resulting a planar surface.

Figure 14:
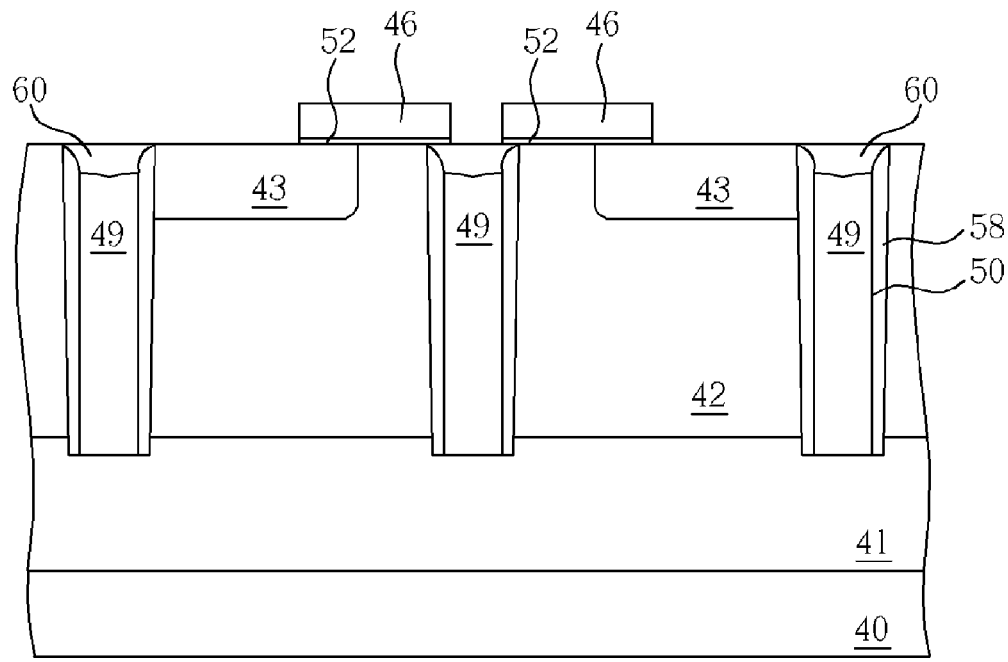

Referring to FIG. 14, the nitride layer 57 is removed, and the pad oxide layer 56 may be removed or not removed and a gate dielectric layer 52 are formed on the covering layer 42 and a part of the body region 43, and a gate electrode 46 is formed on the gate dielectric layer 52.

Finally, a source region 44 is formed within the body region 43 by implanting an N or P type dopants into the top portion of the body region 43. In this embodiment, an N type dopants are implanted to form the source region 44, or a P type dopants are implanted to form a heavily P type doped region 47a within the body region 43, and an N type dopants are implanted to form a heavily N type doped region 48a abutting the heavily P type doped region 47a in the body region 43. The MOS transistor accomplished may be referred as shown in FIG. 3.

All combinations and sub-combinations of the above-described features also belong to the present invention. Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a metal-oxide-semiconductor (MOS) transistor, comprising:
    providing a substrate;
    forming a buried layer of a heavily doped first conductivity type on the substrate;
    forming a covering layer of the first conductivity type on the buried layer;
    forming a body region of a second conductivity type in the covering layer;
    forming a trench having a bottom surface and side surfaces and extending vertically downward from the top surface of the covering layer into the buried layer, wherein the bottom surface of the trench lies in the buried layer;
    performing an etching back process to remove the liner oxide on the bottom surface but not on the side surfaces of the trench;
    forming a liner oxide on the side surfaces and the bottom surface of the trench;
    filling a semiconductor material of the first conductivity type as a source/drain region within the trench to contact the buried layer at the bottom surface of the trench, leaving a space in the top portion of the trench;
    forming a gate on the body region and the covering layer; and
    forming a source/drain region within the body region.

2. The method of claim 1, before filling the semiconductor material within the trench, further comprising:
    performing a blanket heavily N type implantation on the surface of the buried layer in the trench.

3. The method of claim 1, before forming the trench having a bottom surface and side surfaces, further comprising:
    forming a cap layer on the covering layer to cover the body region.

4. The method of claim 3, wherein the cap layer comprises an oxide layer and a nitride layer.

5. The method of claim 1, wherein forming a gate on the body region and the covering layer comprises:
    forming a gate dielectric layer on the body region and the covering layer; and
    forming a gate electrode on the gate dielectric layer.

6. The method of claim 1, further comprising forming a shallow trench insulation in the space in the top portion of the trench.

* * * * *